(12) United States Patent
Kongkanand et al.

(10) Patent No.: US 10,164,265 B2
(45) Date of Patent: Dec. 25, 2018

(54) CORROSION-RESISTANT CATALYST

(71) Applicants: GM GLOBAL TECHNOLOGY OPERATIONS LLC, Detroit, MI (US); THE REGENTS OF THE UNIVERSITY OF COLORADO, a Body Corporate, Denver, CO (US)

(72) Inventors: Anusorn Kongkanand, Rochester Hills, MI (US); Joel W. Clancey, Boulder, CO (US); Steven M. George, Boulder, CO (US)

(73) Assignees: GM Global Technology Operations LLC, Detroit, MI (US); The Regents of the University of Colorado, Denver, CO (US)

( * ) Notice: Subject to any disclaimer, the term of this patent is extended or adjusted under 35 U.S.C. 154(b) by 137 days.

(21) Appl. No.: 15/284,032

(22) Filed: Oct. 3, 2016

(65) Prior Publication Data

US 2017/0117556 A1    Apr. 27, 2017

Related U.S. Application Data

(60) Provisional application No. 62/245,561, filed on Oct. 23, 2015.

(51) Int. Cl.
| | | |
|---|---|---|
| *H01M 4/92* | (2006.01) | |
| *H01M 4/88* | (2006.01) | |
| *C23C 16/18* | (2006.01) | |
| *C23C 16/455* | (2006.01) | |
| *C23C 16/02* | (2006.01) | |
| *C23C 16/44* | (2006.01) | |

(52) U.S. Cl.
CPC ......... *H01M 4/928* (2013.01); *C23C 16/0281* (2013.01); *C23C 16/18* (2013.01); *C23C 16/4417* (2013.01); *C23C 16/45536* (2013.01); *C23C 16/45553* (2013.01); *H01M 4/8828* (2013.01); *H01M 4/8867* (2013.01); *H01M 4/921* (2013.01); *H01M 4/925* (2013.01)

(58) Field of Classification Search
CPC . C23C 16/0281; C23C 16/18; C23C 16/4417; C23C 16/45536; C23C 16/45553; H01M 4/8828; H01M 4/8867; H01M 4/921; H01M 4/925; H01M 4/928
See application file for complete search history.

(56) References Cited

U.S. PATENT DOCUMENTS

| | | | | |
|---|---|---|---|---|
| 8,062,552 | B2 * | 11/2011 | Adzic | B01J 23/42 252/500 |
| 2004/0023104 | A1 * | 2/2004 | Kohler | B01J 37/0219 502/101 |
| 2014/0356765 | A1 * | 12/2014 | Pietrasz | H01M 4/925 429/524 |

FOREIGN PATENT DOCUMENTS

| | | |
|---|---|---|
| JP | 2008-545604 A | 12/2008 |
| WO | 2006/124959 A2 | 11/2006 |

OTHER PUBLICATIONS

V. Tripkovic, F. Abild-Pedersen, F. Studt, I. Cerri, T. Nagami, T. Bligaard, J. Rossmeisl. Metal Oxide-Supported Platinum Overlayers as Proton-Exchange Membrane Fuel Cell Cathodes, ChemCatChem 2012, 4, 228-235.*

Sasaki, K. et al., "Monolayer-Level Ru- and NbO2-Supported Platinum Electrocatalysts for Methanol Oxidation," J. of the Electrochemical Society, 155 (2), (2008), 7 pgs.

* cited by examiner

*Primary Examiner* — Carlos Barcena
(74) *Attorney, Agent, or Firm* — Reising Ethington P.C.

(57) ABSTRACT

A method for forming a corrosion-resistant catalyst for fuel cell catalyst layers is provided. The method includes a step of depositing a conformal Pt or platinum alloy thin layer on $NbO_2$ substrate particles to form Pt-coated $NbO_2$. The Pt-coated $NbO_2$ particles are then incorporated into a fuel cell catalyst layer.

11 Claims, 4 Drawing Sheets

CORROSION-RESISTANT CATALYST

CROSS-REFERENCE TO RELATED APPLICATIONS

This application claims the benefit of U.S. provisional application Ser. No. 62/245,561 filed Oct. 23, 2015, the disclosure of which is hereby incorporated in its entirety by reference herein.

TECHNICAL FIELD

In at least one embodiment, the present invention is related to methods and systems for recovery voltage loss in a fuel cell resulting from anode contamination.

BACKGROUND

Fuel cells are used as an electrical power source in many applications. In particular, fuel cells are proposed for use in automobiles to replace internal combustion engines. A commonly used fuel cell design uses a solid polymer electrolyte ("SPE") membrane or proton exchange membrane ("PEM") to provide ion transport between the anode and cathode.

In proton exchange membrane type fuel cells, hydrogen is supplied to the anode as fuel and oxygen is supplied to the cathode as the oxidant. The oxygen can either be in pure form ($O_2$) or air (a mixture of $O_2$ and $N_2$). PEM fuel cells typically have a membrane electrode assembly ("MEA") in which a solid polymer membrane has an anode catalyst on one face, and a cathode catalyst on the opposite face. The anode and cathode layers of a typical PEM fuel cell are formed of porous conductive materials, such as woven graphite, graphitized sheets, or carbon paper to enable the fuel and oxidant to disperse over the surface of the membrane facing the fuel- and oxidant-supply electrodes, respectively. Each electrode has finely divided catalyst particles (for example, platinum particles) supported on carbon particles to promote oxidation of hydrogen at the anode and reduction of oxygen at the cathode. Protons flow from the anode through the ionically conductive polymer membrane to the cathode where they combine with oxygen to form water which is discharged from the cell. The MEA is sandwiched between a pair of porous gas diffusion layers ("GDL") which, in turn, are sandwiched between a pair of non-porous, electrically conductive elements or plates. The plates function as current collectors for the anode and the cathode, and contain appropriate channels and openings formed therein for distributing the fuel cell's gaseous reactants over the surface of respective anode and cathode catalysts. In order to produce electricity efficiently, the polymer electrolyte membrane of a PEM fuel cell must be thin, chemically stable, proton transmissive, non-electrically conductive and gas impermeable. In typical applications, fuel cells are provided in arrays of many individual fuel cell stacks in order to provide high levels of electrical power.

Carbon black is commonly used to support and dispersed Pt catalyst. However, carbon is susceptible to oxidation at high potential. Corrosion of carbon support results in accelerated Pt coalescence and degraded oxygen transport. Consequently, fuel cell system must implement mechanism to prevent unintended high potential exposure. These controls are particularly challenging on the anode side. There are very limited non-carbon supports that have good stability and sufficient electrical conductivity for use in the fuel cell at a reasonable cost. Among those $NbO_2$ is a good candidate that some have investigated, but $NbO_2$ can be further oxidized to $Nb_2O_5$ which is non-conductive.

Accordingly, there is a need for more durable catalyst systems for the fuel cell catalyst layers.

SUMMARY

The present invention solves one or more problems of the prior art by providing in at least one embodiment, a method for forming a corrosion-resistant catalyst for fuel cell catalyst layers. The method includes a step of depositing a conformal Pt or platinum alloy thin layer on $NbO_2$ substrate particles to form Pt-coated $NbO_2$ particles. The Pt-coated $NbO_2$ particles are then incorporated into a fuel cell catalyst layer. The deposition step uses a reductive $H_2$-plasma atomic layer deposition (ALD) process during which surface $NbO_2$ is reduced to NbO or Nb which has high surface energy and binds strongly to Pt. This results in a layer growth instead of a common 3D growth. Advantageously, the catalyst protected by the Pt layer is highly resistant to a high potential while performing significantly better than the state of the art materials in their Pt surface area retention. As an added benefit, Pt-ALD/$NbO_2$ forms a weaker bound with carbon monoxide ("CO") resulting in lower CO coverage and less positive oxidation peak compared to Pt/C. Therefore, the corrosion-resistant catalysts of the present embodiment are also more CO tolerant catalyst.

In another embodiment, an ink composition that includes the Pt-coated $NbO_2$ particles made by the methods set forth herein is also provided. The ink composition includes Pt-coated $NbO_2$ particles formed by depositing a conformal Pt thin layer or platinum alloy thin layer on $NbO_2$ substrate particles to form the Pt-coated $NbO_2$ particles. The ink composition also includes ionomers and solvent.

DETAILED DESCRIPTION

Figure 1:
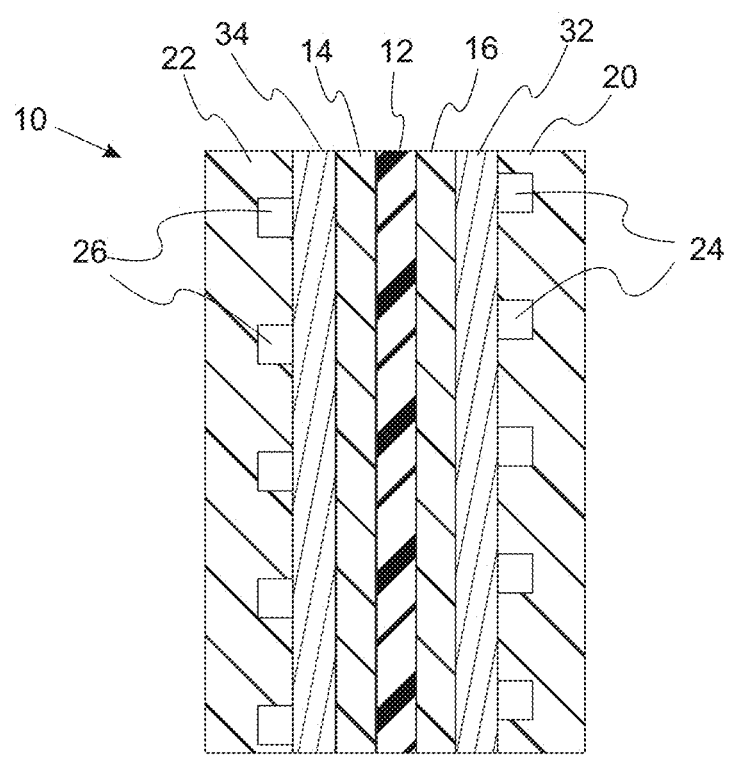
FIG. 1 is a schematic cross section of a fuel cell that incorporates carbon supported catalysts into the anode and/or cathode catalyst layers.

Reference will now be made in detail to presently preferred compositions, embodiments and methods of the present invention which constitute the best modes of practicing the invention presently known to the inventors. The Figures are not necessarily to scale. However, it is to be understood that the disclosed embodiments are merely exemplary of the invention that may be embodied in various and alternative forms. Therefore, specific details disclosed herein are not to be interpreted as limiting, but merely as a representative basis for any aspect of the invention and/or as a representative basis for teaching one skilled in the art to variously employ the present invention.

Except in the examples, or where otherwise expressly indicated, all numerical quantities in this description indicating amounts of material or conditions of reaction and/or use are to be understood as modified by the word "about" in describing the broadest scope of the invention. Practice within the numerical limits stated is generally preferred.

Also, unless expressly stated to the contrary: percent, "parts of," and ratio values are by weight; the description of a group or class of materials as suitable or preferred for a given purpose in connection with the invention implies that mixtures of any two or more of the members of the group or class are equally suitable or preferred; description of constituents in chemical terms refers to the constituents at the time of addition to any combination specified in the description and does not necessarily preclude chemical interactions among the constituents of a mixture once mixed; the first definition of an acronym or other abbreviation applies to all subsequent uses herein of the same abbreviation and applies mutatis mutandis to normal grammatical variations of the initially defined abbreviation; and, unless expressly stated to the contrary, measurement of a property is determined by the same technique as previously or later referenced for the same property.

It is also to be understood that this invention is not limited to the specific embodiments and methods described below, as specific components and/or conditions may, of course, vary. Furthermore, the terminology used herein is used only for the purpose of describing particular embodiments of the present invention and is not intended to be limiting in any way.

It must also be noted that, as used in the specification and the appended claims, the singular form "a," "an," and "the" comprise plural referents unless the context clearly indicates otherwise. For example, reference to a component in the singular is intended to comprise a plurality of components.

The term "comprising" is synonymous with "including," "having," "containing," or "characterized by." These terms are inclusive and open-ended and do not exclude additional, unrecited elements or method steps.

The phrase "consisting of" excludes any element, step, or ingredient not specified in the claim. When this phrase appears in a clause of the body of a claim, rather than immediately following the preamble, it limits only the element set forth in that clause; other elements are not excluded from the claim as a whole.

The phrase "consisting essentially of" limits the scope of a claim to the specified materials or steps, plus those that do not materially affect the basic and novel characteristic(s) of the claimed subject matter.

With respect to the terms "comprising," "consisting of," and "consisting essentially of," where one of these three terms is used herein, the presently disclosed and claimed subject matter can include the use of either of the other two terms.

Throughout this application, where publications are referenced, the disclosures of these publications in their entireties are hereby incorporated by reference into this application to more fully describe the state of the art to which this invention pertains.

Abbreviations:

"ALD" means atomic layer deposition.

"AST" means accelerated stability test.

"ECSA" means electrochemically active surface area of Pt as determined by measuring the charge of hydrogen adsorption-desorption or by measuring the charge of the oxidation of pre-adsorbed carbon monoxide.

"TEM" means transmission electron microscopy.

FIG. 1 provides a cross-sectional view of a fuel cell that incorporates the corrosion resistant catalysts described below. PEM fuel cell 10 includes polymeric ion conducting membrane 12 disposed between cathode electro-catalyst layer 14 and anode electro-catalyst layer 16. Advantageously, cathode electro-catalyst layer 14 and anode electro-catalyst layer 16 include the corrosion resistant catalysts. In particular, the corrosion resistant catalyst is incorporated into anode electro-catalyst layer 16. Fuel cell 10 also includes electrically conductive flow field plates 20, 22 which include gas channels 24 and 26. Flow field plates 20, 22 are either bipolar plates (illustrated) or unipolar plates (i.e., end plates). In a refinement, flow field plates 20, 22 are formed from a metal plate (e.g., stainless steel) optionally coated with a precious metal such as gold or platinum. In another refinement, flow field plates 20, 22 are formed from conducting polymers which also are optionally coated with a precious metal. Gas diffusion layers 32 and 34 are also interposed between flow field plates and a catalyst layer. During operation, hydrogen is supplied to the anode catalyst layer 14 as fuel and oxygen is supplied to the cathode catalyst layer 16 as the oxidant, thereby producing electricity as the result of the electrochemical process therein.

In an embodiment, a method for forming a corrosion-resistant catalyst for fuel cell catalyst layers is provided. The method includes a step of depositing a conformal Pt or platinum alloy thin layer on $NbO_2$ substrate particles to form Pt-coated $NbO_2$ particles. The Pt-coated $NbO_2$ particles are then incorporated into a fuel cell catalyst layer. The deposition step uses a reductive $H_2$-plasma atomic layer deposition (ALD) process during which surface $NbO_2$ is reduced to NbO or Nb which has high surface energy and binds strongly to Pt. This encourages wetting of Pt on the substrate surface and results in a layer growth instead of a common 3D growth. After the initial nucleation stage, during the film growth stage when Pt is grown on Pt surface, it was also found that H2 plasma is no longer a necessity. Deposition techniques such as $H_2$ thermal ALD are also effective. In a refinement, the Pt thin layer has a thickness from about 0.3 to 20 nm. In another refinement, the Pt thin layer has a thickness from about 1 to 4 nm. Advantageously, the catalyst protected by the Pt layer is highly resistant to a high potential while performing significantly better than the state of the art materials in their Pt surface area retention. As an added benefit, Pt-ALD/$NbO_2$ forms a weaker bound with carbon monoxide ("CO") resulting in lower CO coverage and less positive oxidation peak compared to Pt/C. Therefore, the corrosion-resistant catalysts of the present embodiment are also more CO tolerant catalyst.

In a variation, step of depositing a conformal Pt thin layer on $NbO_2$ substrate particles includes a deposition cycle in which the $NbO_2$ substrate particles are contacted with vapor of a platinum-containing compound, e.g. trimethyl(methylcyclopentadienyl)platinum, such that at least a portion of the vapor of the first compound adsorbs or reacts with a substrate surface to form a modified surface. The deposition cycle further optionally includes contacting the modified surface with a vapor of a reducing agent (e.g., hydrogen) to react and form at least a portion of the conformal Pt thin layer (or platinum alloy thin layer). In a refinement, the reducing agent is formed by reductive $H_2$-plasma. Typically, the deposition cycle is at a temperature from about 50 to 400° C. In one refinement, the pressure for each deposition cycle is from about $10^{-6}$ Torr to about 760 Torr. In another refinement, the pressure for each deposition cycle is from about 0.1 millitorr to about 10 Torr. In still another refinement, the pressure for each deposition cycle is from about 10 to about 2000 millitorr. In yet another refinement, the pressure is from about 100 to 500 millitorr. In a refinement, the $NbO_2$ substrate is subjected to 1 to 5000 deposition cycles. In another refinement, the $NbO_2$ substrate is subjected to 10 to 300 deposition cycles. In still another refinement, the NbO$_2$ substrate is subjected to 10 to 100 deposition cycles.

Figure 2:
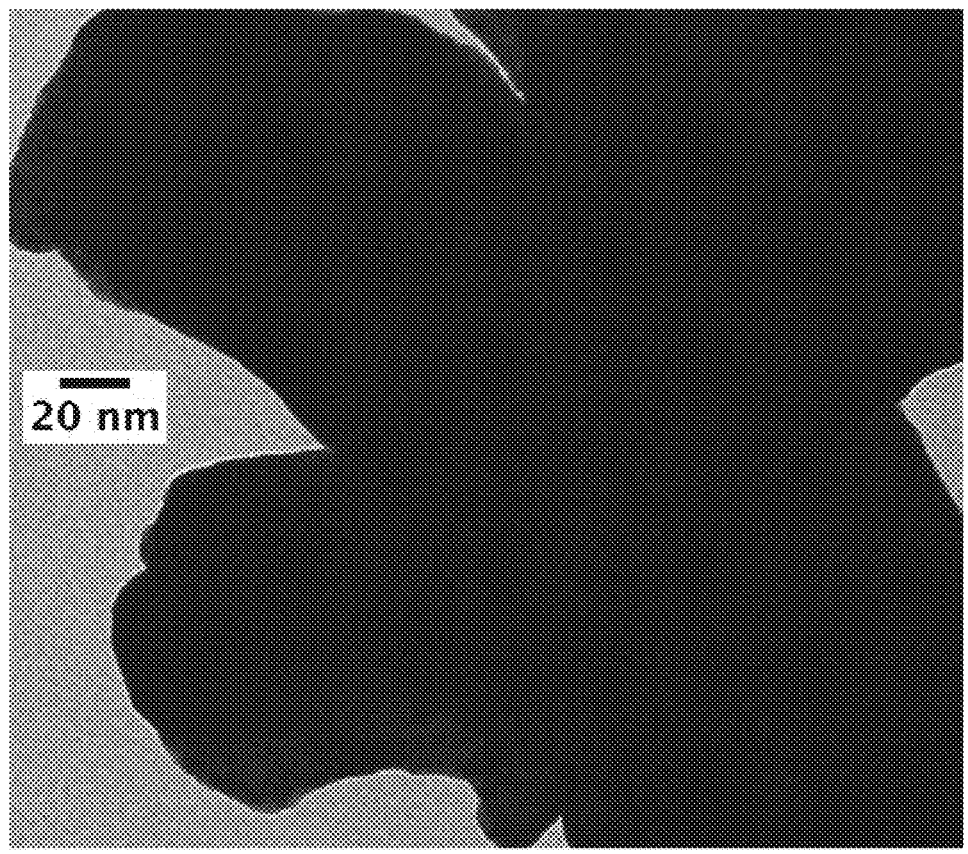
FIG. 2 provides TEM showing conformal coating of Pt on $NbO_2$ using $H_2$-plasma ALD process.

In another embodiment, the Pt-coated NbO$_2$ particles set forth above are used in an ink composition to form fuel cell catalyst layers by methods known to those skilled in fuel cell technology. In a refinement, the ink composition includes the Pt-coated NbO$_2$ particles in an amount of about 1 weight percent to 10 weight percent of the total weight of the ink composition. In a refinement, the ink composition includes ionomers (e.g., a perfluorosulfonic acid polymer such as NAFION®) in an amount from about 5 weight percent to about 40 weight percent of the ink composition. Typically, the balance of the ink composition is solvent. Useful solvents include, but are not limited to, alcohols (e.g., propanol, ethanol, and methanol), water, or a mixture of water and alcohols. Characteristically, the solvents evaporate at room temperature. FIG. 2 provides TEM showing conformal coating of Pt on NbO$_2$ using H$_2$-plasma ALD process.

Figure 3:
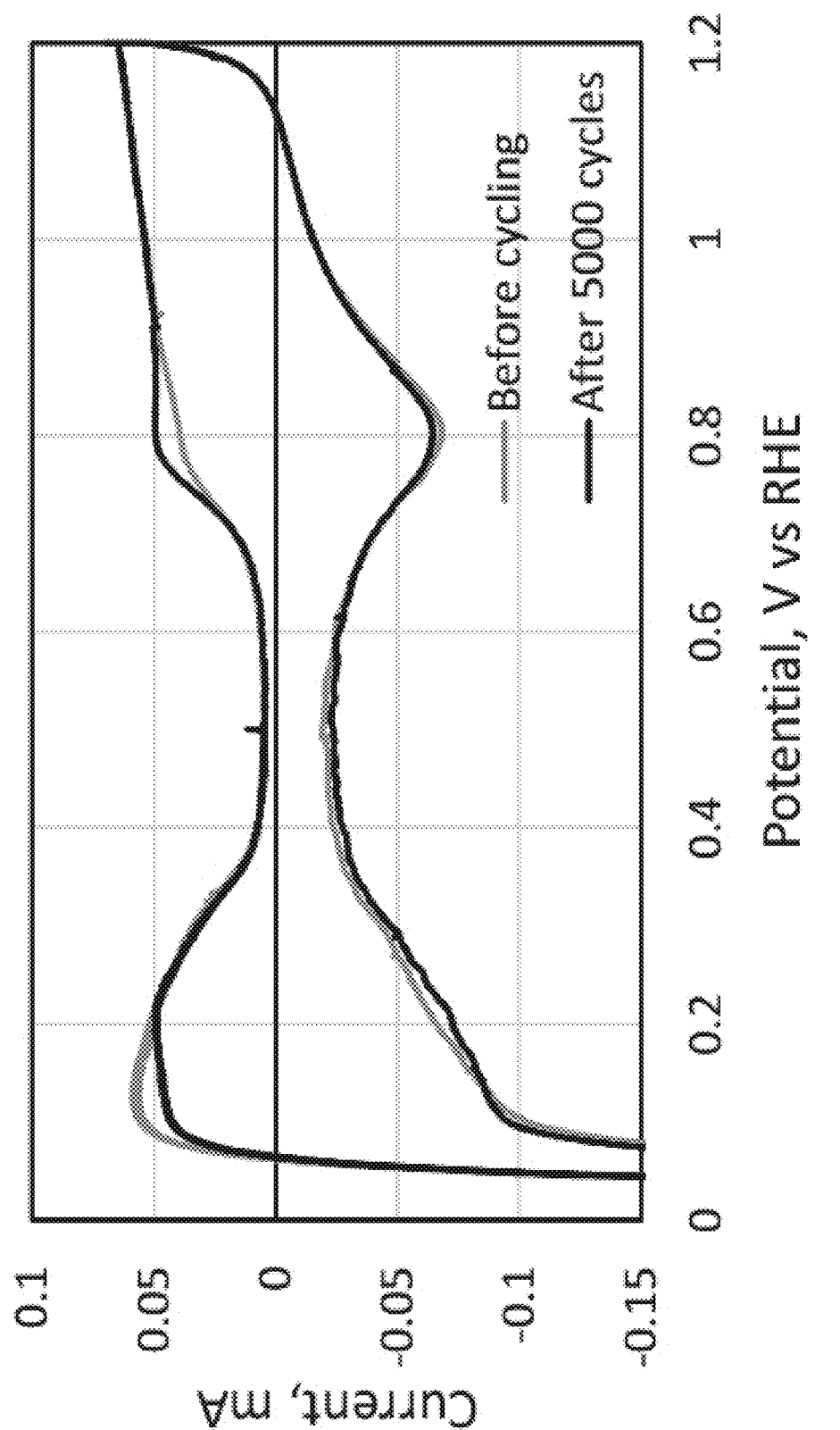
FIG. 3 provides voltamograms of Pt/$NbO_2$ before and after the accelerated stability test.
Figure 4:
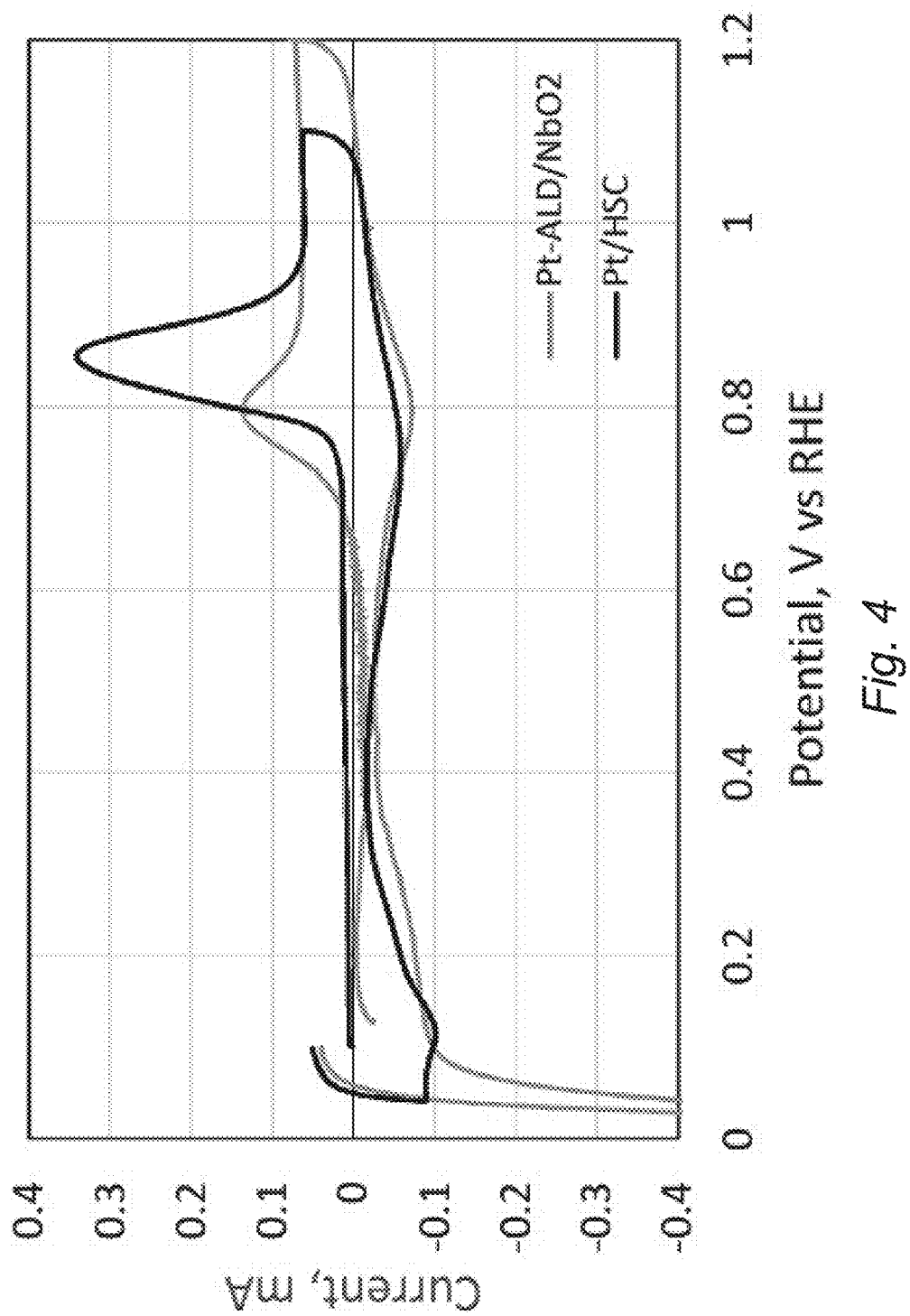
FIG. 4. Comparison of CO stripping voltamgrams of Pt/NbO2 and Pt/C.

FIG. 3 provides voltammograms of Pt/NbO$_2$ before and after the accelerated stability test showing negligible degradation. FIG. 4 provides a comparison of CO stripping voltammograms of Pt/NbO2 and Pt/C, showing lower adsorbed CO and less positive oxidation potential observed on Pt/NbO2, indicating higher CO tolerance. Table 1 summarizes the electrochemical property change after AST test. Low ECSA measured by CO compared to those measured by HAD indicates lower CO adsorption. This suggests improved tolerance to CO contaminant of the Pt/NbO$_2$ catalyst, preferable for a fuel cell electrode.

|  | ECSA ($Q_{CO}$) | ECSA ($Q_{HUPD}$) | Specific Activity ($Q_{HUPD}$) uA/cm$^2_{Pt}$ | Mass Activity mA/mg$_{Pt}$ |
|---|---|---|---|---|
| Before 5000 cycles AST | 4.8 | 14.2 | 240 | 40 |
| After 5000 cycles AST | 6.4 | 13.7 | 211 | 34 |

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for forming a corrosion-resistant catalyst comprising:
   depositing a conformal platinum layer or platinum alloy layer on NbO$_2$ substrate particles to form Pt-coated NbO$_2$ particles, the depositing of the conformal platinum layer or platinum alloy layer comprising a reductive H$_2$-plasma atomic layer deposition process during which a surface layer of the NbO$_2$ substrate particles is reduced to NbO or Nb and platinum or platinum alloy is grown on the surface layer; and
   incorporating the Pt-coated NbO$_2$ particles into a fuel cell catalyst layer.

2. The method of claim 1 wherein, following the growth of platinum or platinum alloy on the surface layer of NbO or Nb by the reductive H$_2$-plasma atomic layer deposition process, platinum or platinum alloy is grown on the already-deposited platinum or platinum alloy by a H$_2$ thermal atomic layer deposition process.

3. The method of claim 1 wherein a platinum alloy layer is deposited, the platinum alloy layer including a component selected from the group consisting of platinum-iridium alloys, platinum-palladium alloys, and platinum-gold alloys.

4. The method of claim 1 wherein the platinum layer or platinum alloy layer has a thickness from about 0.3 to 20 nm.

5. The method of claim 1 wherein a conformal platinum layer is deposited on NbO$_2$ substrate particles, and wherein the reductive H$_2$-plasma atomic layer deposition process comprises a deposition cycle in which (1) the NbO$_2$ substrate particles are contacted with vapor of a platinum-containing compound such that at least a portion of the vapor of the platinum-containing compound adsorbs or reacts with a surface of the NbO$_2$ substrate particles to form a modified surface and (2) the modified surface of the NbO$_2$ substrate particles is contacted with H$_2$ plasma to deposit platinum and form at least a portion of the conformal platinum layer.

6. The method of claim 5 wherein the platinum-containing compound is trimethyl(methylcyclopentadienyl)platinum.

7. The method of claim 5 wherein the deposition cycle is at a temperature from about 50 to 400 °C.

8. The method of claim 5 wherein a pressure for the deposition cycle is from about $10^{-6}$ Torr to about 760 Torr.

9. The method of claim 5 wherein a pressure for the deposition cycle is from about 0.1 millitorr to about 10 Torr.

10. The method of claim 5 wherein the NbO$_2$ substrate particles are subjected to 1 to 5000 deposition cycles.

11. The method of claim 5 wherein the NbO$_2$ substrate particles are subjected to 10 to 300 deposition cycles.

* * * * *